United States Patent
Nishimura et al.

(10) Patent No.: US 8,871,410 B2
(45) Date of Patent: Oct. 28, 2014

(54) METHOD FOR PRODUCING PATTERN PHASE DIFFERENCE FILM

(75) Inventors: Hiroyuki Nishimura, Tokyo (JP); Yoshihide Nakao, Tokyo (JP); Tomoya Kawashima, Tokyo (JP); Keiji Kashima, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 14/238,996

(22) PCT Filed: Aug. 2, 2012

(86) PCT No.: PCT/JP2012/069660
§ 371 (c)(1),
(2), (4) Date: Feb. 14, 2014

(87) PCT Pub. No.: WO2013/031467
PCT Pub. Date: Mar. 7, 2013

(65) Prior Publication Data
US 2014/0178597 A1    Jun. 26, 2014

(30) Foreign Application Priority Data
Aug. 31, 2011    (JP) ................................. 2011-188383

(51) Int. Cl.
*G02B 5/30*    (2006.01)
*G03F 1/00*    (2012.01)

(52) U.S. Cl.
USPC ............................................. 430/5; 430/321

(58) Field of Classification Search
None
See application file for complete search history.

(56) References Cited

U.S. PATENT DOCUMENTS

| 2010/0225864 A1 | 9/2010 | Inoue et al. | |
| 2012/0212714 A1* | 8/2012 | Choi et al. | 355/53 |
| 2013/0143007 A1* | 6/2013 | Kim et al. | 428/195.1 |

FOREIGN PATENT DOCUMENTS

| EP | 2372433 A2 | 10/2011 |
| JP | A-63-64337 | 3/1988 |
| JP | A-1-171454 | 3/1999 |
| JP | A-2002-098969 | 4/2002 |
| JP | A-4493697 | 4/2010 |
| JP | A-2012-042530 | 3/2012 |
| WO | WO 2009/037889 A1 | 3/2009 |

OTHER PUBLICATIONS

Aug. 27, 2013 Office Action issued in Japanese Patent Application No. 2011-188383 (with English Translation).

* cited by examiner

*Primary Examiner* — John A. McPherson
(74) *Attorney, Agent, or Firm* — Oliff PLC

(57) ABSTRACT

The present invention pertains to a pattern phase difference film, which is used to display 3D images using a passive system, and provides a method for producing a pattern phase difference film that can be manufactured with high precision, easily and in large quantities. In a mask provided for manufacturing an alignment film, slits, which are provided for exposure treatment, are made so as to gradually narrow toward the ends in the longitudinal direction.

4 Claims, 5 Drawing Sheets

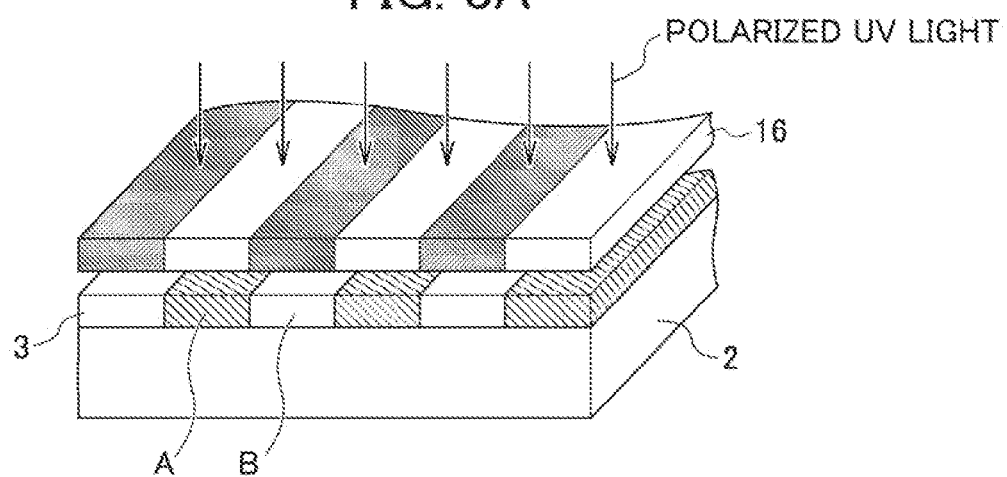
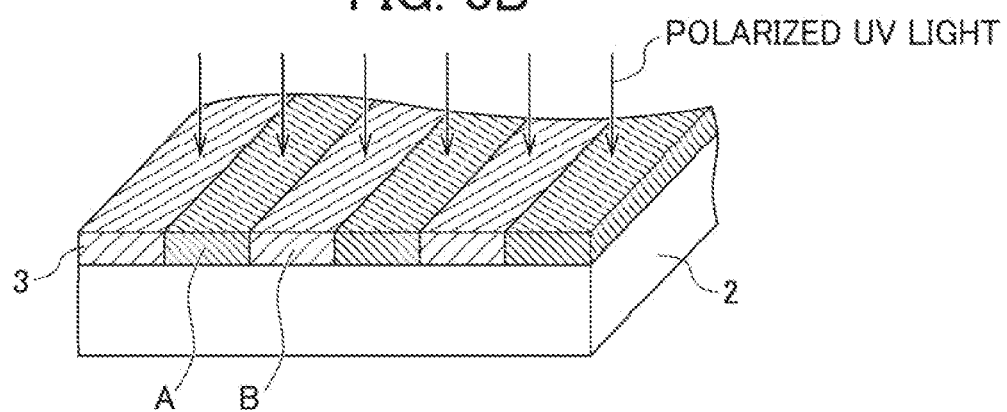

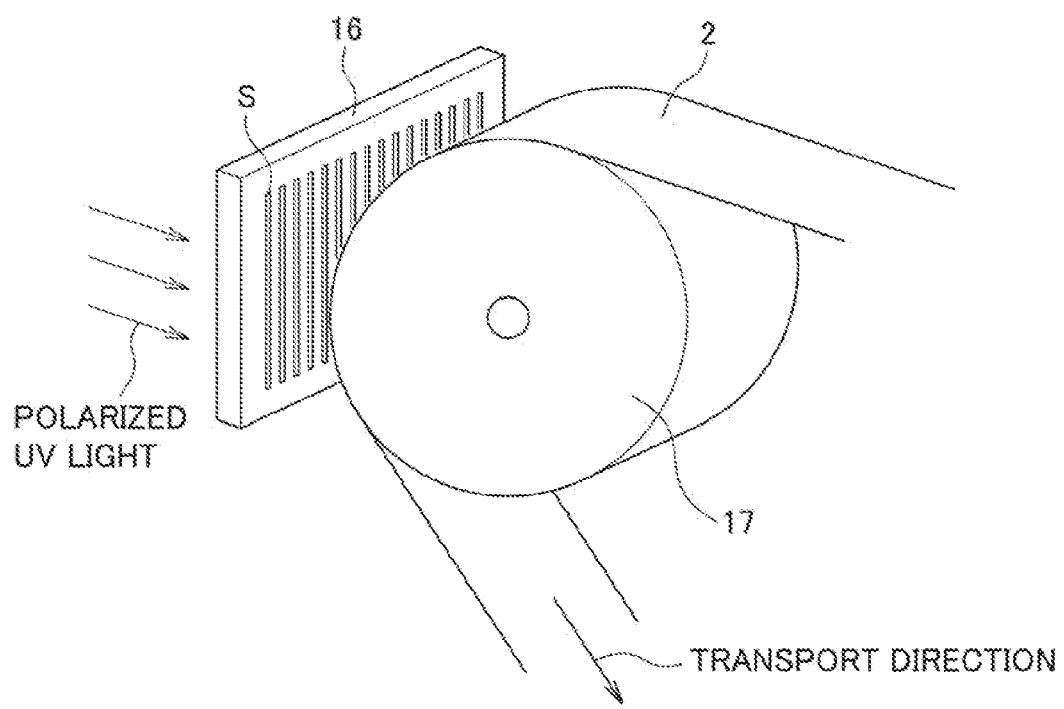

TRANSPORT DIRECTION

METHOD FOR PRODUCING PATTERN PHASE DIFFERENCE FILM

TECHNICAL FIELD

The present invention relates to a method for producing a pattern phase difference film applied to a 3D image display using a passive system.

BACKGROUND ART

To date, 2D display has been the mainstream in most flat panel display devices. However, in recent years, flat panel display devices capable of performing 3D display have drawn much attention, and some of them are coming onto the market. Since it is expected that future flat panel display devices will tend to be naturally required to have a 3D display function, the flat panel display devices capable of performing 3D display have been widely researched in a wide range of fields.

In general, in order to perform 3D displaying on a flat panel display device, a right-eye image and a left-eye image need to be selectively applied to the right and left eyes of a viewer in a certain method. For example, as a method for selectively applying the right-eye image and the left-eye image, a passive-type 3D display method is known. The passive-type 3D display method will be described with reference to the drawings. FIG. 8 is a schematic diagram illustrating an example of a passive-type 3D display using a liquid crystal display panel. In the example illustrated in FIG. 8, in a liquid crystal display panel, vertically consecutive pixels are sequentially and alternately allocated for right-eye pixels and left-eye pixels and are driven according to right-eye image data and left-eye image data, so that a right-eye image and a left-eye image are simultaneously displayed. Furthermore, a pattern phase difference film is arranged on a panel surface of the liquid crystal display panel to convert linearly polarized light beams emitted from the right-eye pixels and left-eye pixels into circularly polarized light beams having different polarization directions for the right-eye image and the left-eye image. Accordingly, in the passive type, a viewer puts on glasses with corresponding polarizing filters, so that a right-eye image and a left-eye image are selectively applied to the right and left eyes of the viewer.

The passive type can be applied to a liquid crystal display device having a low response speed, and 3D displaying can be performed with a simple and easy configuration employing a pattern phase difference film and circular polarizing glasses. Therefore, a passive-type liquid crystal display device has drawn much attention as a key component for a next-generation display device.

In the pattern phase difference film associated with the passive type, a pattern-shaped phase difference layer applying phase difference to transmitting light corresponding to pixel allocation is necessary. The pattern phase difference film has not been widely researched and developed yet, and no standard technique thereof has been established as yet.

With respect to the pattern phase difference film, Patent Document 1 discloses a method for producing a pattern phase difference film by forcing a photo-alignment film which controls an alignment regulation force on a glass substrate and the patterning arrangement of the liquid crystal molecules by using the photo-alignment film. However, in the method disclosed in Patent Document 1, since the glass substrate needs to be used and the pattern phase difference film is expensive, there is a problems in that it is difficult to perform mass production of large-area pattern phase difference film.

In addition, with respect to the pattern phase difference film, Patent Document 2 discloses a method for producing a photo-alignment film which controls the alignment regulation force in a patterned shape by forming a fine convex-concave shape in the periphery of the roll plate through laser irradiation and by transferring the convex-concave shape onto the film. In the method disclosed in Patent Document 2, the entire circumference of the roll plate needs to be irradiated by laser in full through laser scanning. Therefore, there is a problem in that much time is taken to manufacture the roll plate. In addition, there is a problem in that an expensive laser machining apparatus needs to be used.

[Patent Document 1] Japanese Unexamined Patent Application, Publication No. 2005-49865
[Patent Document 2] Japanese Unexamined Patent Application, Publication No. 2010-152296

DISCLOSURE OF THE INVENTION

Problems to be Solved by the Invention

The present invention has been achieved in view of such circumstances, and an object thereof is to provide a pattern phase difference film applied to passive-type 3D image display and a method capable of simply and easily performing mass production of the pattern phase difference film with high accuracy.

Means for Solving the Problems

The inventor of the present invention conducted thorough investigations in order to achieve the object, and as a result, the present invention was completed by considering that in a mask used for forming an alignment film, slits used for an exposure process are formed so as to have a width being gradually decreased in the direction toward end portions in the longitudinal direction of the slits.

(1) According to an aspect of the present invention, a method is provided for producing a patterned phase difference film by sequentially processing an elongated transparent film material while transporting the elongated transparent film material, including:

forming a photo-alignment material film on the transparent film material;

forming an alignment film by performing an exposure process on the photo-alignment material film by using a mask through a photo-alignment method; and forming a phase difference layer of a right-eye area applying phase difference corresponding to right-eye transmitting light and a left-eye area applying phase difference corresponding to left-eye transmitting light on the alignment film, wherein the exposure process is performed by irradiation of light through the mask disposed to face a roll while transporting the transparent film material wound around the roll, wherein the mask is formed so that slits which are used for the exposing of the photo-alignment material film and extend in the transport direction of the transparent film material are repetitively formed in the direction perpendicular to the extension direction, and wherein the slit is formed so that one end side or two end sides in the longitudinal direction of the slit have a width being gradually decreased in the direction toward end portions of the slit.

According to the aspect (1), the patterned phase difference film can be produced by performing consecutive processes on the elongated transparent film material so that it is possible to simply and easily produce the patterned phase difference film in mass production. In addition, since the slits of the mask are formed to have a width being gradually decreased in the direction toward end portions in the longitudinal direction of the slits, even in the case where the exposure process is performed while transporting the transparent film material wound around the roll, the exposure process can be performed with high accuracy by a sufficient light amount due to an increase in length of the slits so that it is possible to effectively produce the patterned phase difference film with high accuracy.

(2) In the method for producing a patterned phase difference film of the above aspect (1), the slit is formed so that the central portion in the longitudinal direction of the slit has a constant width.

According to the aspect (2), in the range where the exposure process can be performed with sufficient accuracy, the slits are formed according to the area width of the areas to be exposed so that it is possible to effectively perform the exposure process.

Effects of the Invention

It is possible to simply and easily perform mass production of a patterned phase difference film with high accuracy.

BRIEF DESCRIPTION OF THE DRAWINGS

FIGS. 3A and 3B are diagrams illustrating the exposure process of FIG. 2.

FIG. 4 is a diagram illustrating equipment used for the exposure process of FIG. 2.

EXPLANATION OF REFERENCE NUMERALS

1: Patterned phase difference film
2: Substrate
3: Alignment film
4: Phase difference layer
16: Mask
17: Roll
S: Slit

PREFERRED MODE FOE CARRYING OUT THE INVENTION

[First Embodiment]

Figure 1:
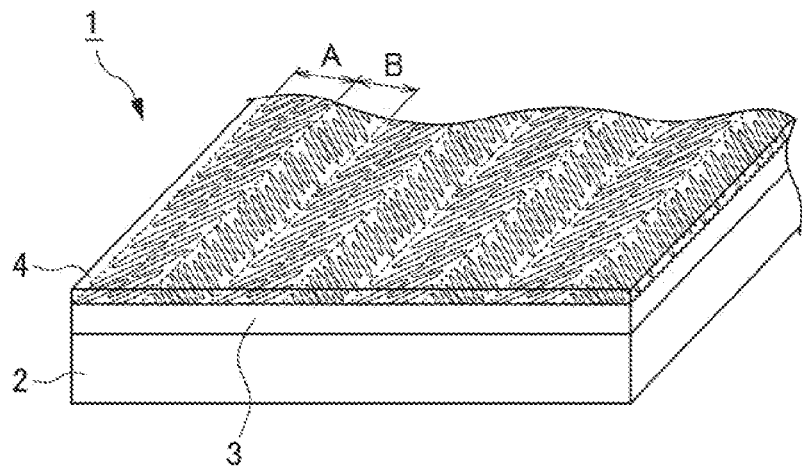
FIG. 1 is a diagram illustrating a patterned phase difference film according to the first embodiment of the present invention.

FIG. 1 is a diagram illustrating the pattern phase difference film according to the first embodiment of the present invention. A pattern phase difference film 1 is produced by sequentially installing an alignment film 3 and a phase difference layer 4 on a substrate 2 made of a transparent film material. In the pattern phase difference film 1, the phase difference layer 4 is made of a liquid crystal material, and alignment of the liquid crystal material is patterned by the alignment regulation force of the alignment film 3. In FIG. 1, the alignment of the liquid crystal molecules is indicated by an elongated ellipse. In the pattern phase difference film 1, right-eye areas A and left-eye areas B with predetermined widths are sequentially and alternately formed in a stripe shape corresponding to allocation of pixels of a liquid crystal display panel through the patterning, so that the corresponding phase differences are provided to light beams emitted from right-eye pixels and left-eye pixels.

In the pattern phase difference film 1, after the photo-alignment material film is formed by using a photo-alignment material, the alignment film 3 is formed by irradiating a photo-alignment material film with a UV light having linear polarization according to so-called photo-alignment method. Herein, polarization directions of the UV light irradiated on the photo-alignment material film are set to be different by 90 degrees between the right-eye area A and the left-eye area B. Therefore, with respect to the liquid crystal material installed in the phase difference layer 4, the liquid crystal molecules are aligned in the directions corresponding to the right-eye area A and the left-eye area B, so that the corresponding phase differences are provided to the transmitting light beams.

Figure 2:
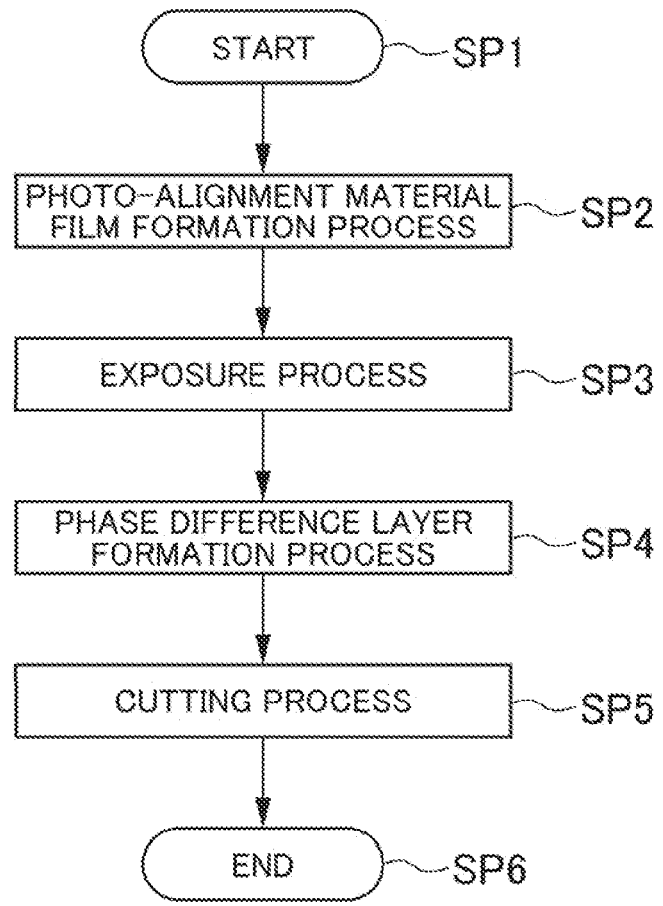
FIG. 2 is a flochart illustrating a method for producing the patterned phase difference film of FIG. 1.

FIG. 2 is a flowchart illustrating a method for producing the pattern phase difference film 1. In the method for producing the pattern phase difference film 1, the substrate 2 is provided as an elongated film wound around a roll, and the substrate 2 is extracted from the roll so that the photo-alignment material film is sequentially formed (Steps SP1 and SP2). Herein, although the photo-alignment material film may be formed by applying various manufacturing processes, in the embodiment, the photo-alignment material film is formed by applying a film formation solution in which a photo-alignment material is dispersed in a solvent such as benzene by a die, and after that, by drying. In addition, although various materials being applicable to the photo-alignment method may be used as the photo-alignment material, in the embodiment, a material of which alignment is not changed by UV light irradiation after the alignment, for example, a photo-dimerization type material is used. In addition, examples of the photo-dimerization type material are disclosed in "M. Schadt, K. Schmitt, V. Kozinkov and V. Chigrinov: Jpn. J. Appl. Phys., 31, 2155 (1992)", "M. Schadt, H. Seiberle and A. Schuster: Nature, 381, 212 (1996)", and the like, and a material, for example, "ROP-103" (product name) is already commercialized. In addition, for example, triacetyl cellulose is used as the substrate 2.

Next, in the producing method, the photo-alignment film is formed by UV light irradiation through an exposure process (Step SP3). Subsequently, in the phase difference layer formation process of the producing method, the phase difference layer 4 is formed by applying a liquid crystal material by a die or the like and curing the liquid crystal material by UV light irradiation (Step SP4). Subsequently, in the producing method, if necessary, an anti-reflection film formation process or the like is performed, and after that, in a cutting process, the pattern phase difference film 1 is produced by cutting into the desired size (Steps SP5 and SP6).

FIG. 3A and 3B are detailed diagram illustrating the exposure process. In the producing method, by irradiation of UV light (polarized UV light) having linear polarization through masks 16 blocking portions corresponding to the right-eye areas A and the left-eye areas B, the photo-alignment material film in the non-blocked left-eye areas B or right-eye areas A is aligned in the desired direction (FIG. 3A). Therefore, in the producing method, the first exposure process is performed. Subsequently, in the producing method, the entire surface is irradiated with UV light having linear polarization the direction of which is different by 90 degrees from the polarization direction in the first exposure process, and the photo-alignment material film in the right-eye areas A or the left-eye areas B which is not exposed in the first exposure process is aligned in a desired direction (FIG. 3B). Therefore, in the producing method, the right-eye areas A and the left-eye areas B are sequentially exposed through the two exposure processes, so that the alignment film 3 is formed.

FIG. 4 is a diagram illustrating equipment used for a first exposure process. In the producing method, a substrate 2 wound around a roll 17 having a large diameter is allowed to be transported, a mask 16 is disposed to face the roll 17, and irradiation of linearly polarized UV light is performed through the mask 16. In the mask 16, slits S extending in the transport direction of the substrate 2 are repetitively formed with a certain pitch in the direction perpendicular to the extension direction, and the substrate 2 is irradiated with UV light through the slits S.

In this manner, in the case where the patterned phase difference film 1 is produced by performing the consecutive processes on the elongated transparent film, it is possible to improve productivity by transporting the substrate 2 at a high speed. Therefore, it is necessary to perform the exposure process in a short time. As a method for shortening the exposure time in the exposure process, there is a method for increasing the light amount of a light source. However, in this method, it is necessary to greatly reform the light source, and in some cases, it may be difficult to perform the reforming.

On the other hand, a method for increasing the light amount irradiated on the substrate 2 by setting the slit S to have a large length may also be considered. However, as illustrated in FIG. 4, in the case of performing the exposure process while transporting the substrate 2 in the state of being wound around the roll 17, it is necessary to secure a certain degree of the distance between the substrate 2 and the mask 16, and it is not possible to maintain the light from the light source as completely parallel light in these types of facilities. Therefore, if the slit S is set to have a large length, the exposing accuracy is reduced so that it is difficult to pattern right-eye areas and left-eye areas of the patterned phase difference film 1 with high accuracy.

In addition, like this, in the case where the formation accuracy of the right-eye areas and the left-eye areas is decreased, the difference in area width between the right-eye areas and the left-eye areas is increased, so that when the patterned phase difference film 1 is installed on the liquid crystal display panel, the difference in area width is seen as a lateral stripe. In addition, if the roll 17 is set to have a large diameter, the deterioration in patterning accuracy caused in the case where the slit S is set to have a large length can be reduced. However, in this case, it is difficult to maintain the substrate 2 at an appropriate temperature due to the increase in heat capacity of the roll 17, so this method is not practical.

Therefore, in the embodiment, one slit S is formed by setting the slit S to have a large length and setting the slit S to have a width of being gradually decreased in the direction toward end portions in the longitudinal direction of the slit S. Accordingly, in the embodiment, the deterioration in accuracy is effectively prevented, and thus, the light amount irradiated on the substrate 2 is increased so that the substrate 2 is transported at a high speed.

Figure 5:
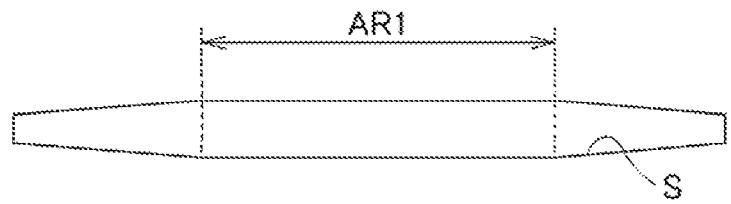
FIG. 5 is a diagram illustrating the slit formed on a mask.

FIG. 5 is a plan diagram illustrating the slit S formed on the mask 16. In the area range AR1 where the slit S straightly faces the roll 17 and the exposure process can be performed with sufficient accuracy, the slit S is formed according to the area width of the areas to be exposed. In addition, at the two end sides of the area range AR1, the slit S is formed so as to have a width being gradually decreased in the direction from the central portion of the slit S toward the end portions of the slit S. In the embodiment, in the portions of which the width is gradually decreased, the width is set to be decreased in a linear function so that the slit is formed in a trapezoidal shape.

Accordingly, in the embodiment, even in the case of transporting the substrate 2 at a high speed, the deterioration in accuracy is affectively prevented, and thus, the exposure process is performed with a sufficient light amount so that it is possible to simply and easily produce the patterned phase difference film with high accuracy in mass production. According to the results of various experiments, with respect to the case where the exposure process is performed in the state that the slit S is limited to the length of the area range AR1, it can be observed that in the embodiment the exposure processes can be performed with an equivalent accuracy by setting the transport speed of the substrate 2 to be double speed.

In the embodiment, in the mask used for forming an alignment film, the slits S used for the exposure process are formed to have a width being gradually decreased in the direction toward the end portions in the longitudinal direction of the slits S so that even in the case of performing the exposure process while transporting the substrate at a high speed in the state of being wound around the roll, it is possible to secure sufficient accuracy. Therefore, it is possible to simply and easily produce the patterned phase difference film at high accuracy in mass production.

[Other Embodiments]

Hereinbefore, although specific configurations suitable for embodiments of the present invention are described in detail, the configurations of the above-described embodiments of the present invention can be changed into various configurations without departing from the spirit of the present invention.

Figure 6:
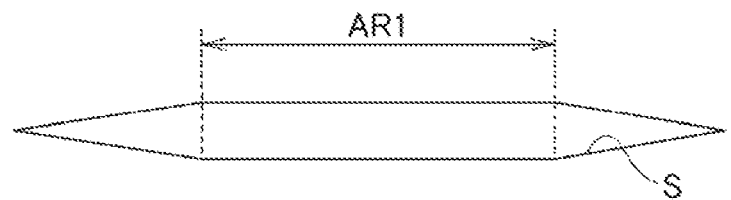
FIG. 6 is a diagram illustrating another example of the slit.
Figure 7:
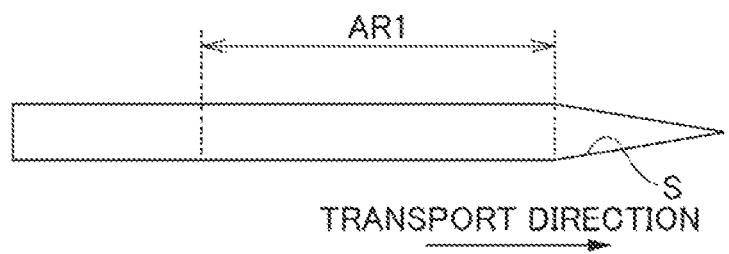
FIG. 7 is a diagram illustrating an example of a slit different from the slit of FIG. 6.
Figure 8:
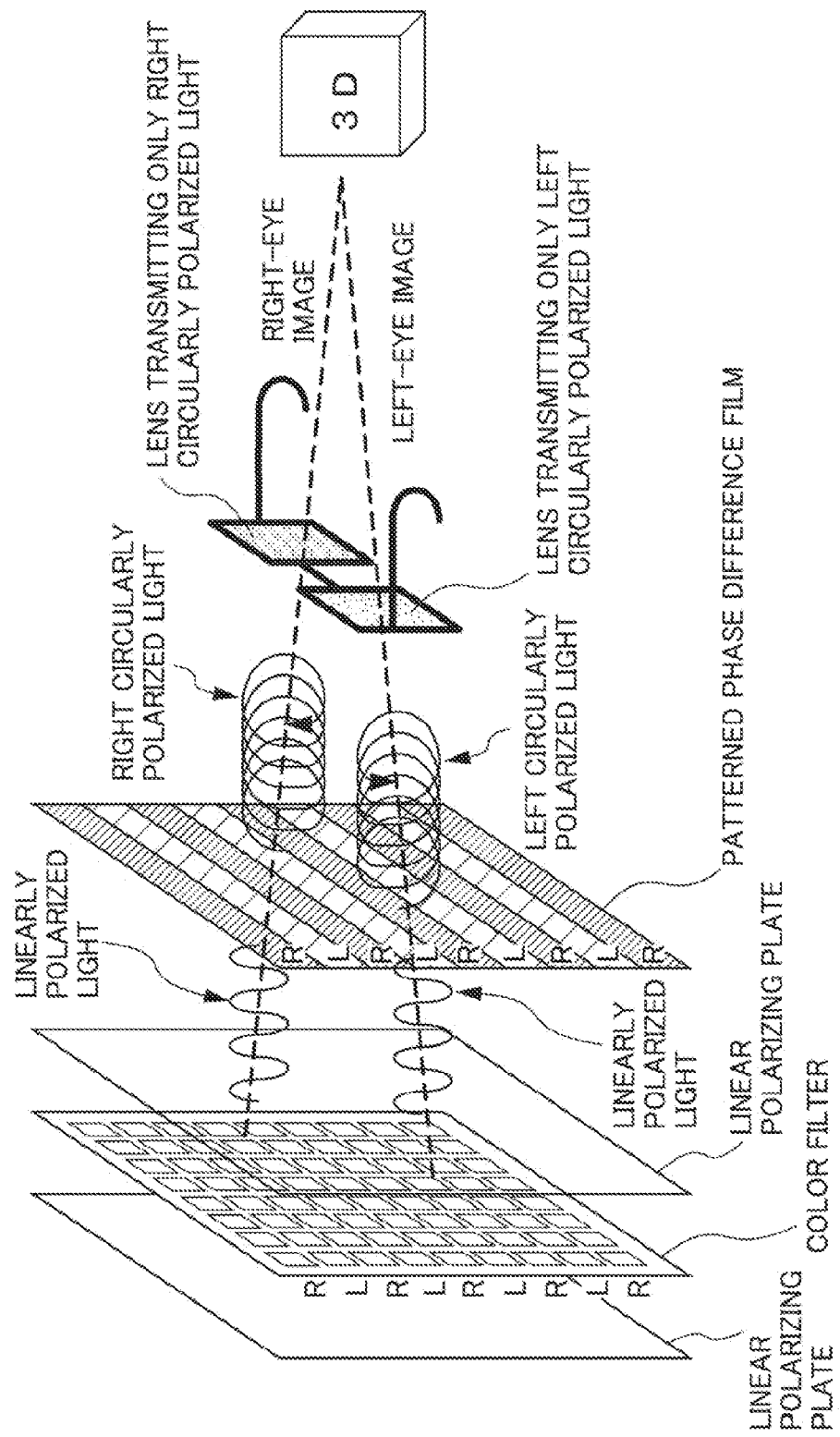
FIG. 8 is a diagram illustrating passive-type 3D image display.

In other words, as illustrated in FIG. 6 in comparison to FIG. 5, the slit S may be formed so that each of the two ends in the longitudinal direction has a triangular shape, or so that the width is gradually changed in a curve with a quadratic function or the like instead of being changed in a linear function. In addition, as illustrated in FIG. 7, in the case where sufficient accuracy can be secured in practical use, only the one side of the slit may be set to have a gradually decreasing width.

In addition, in the above-described embodiments, the case of exposing one of the right-eye areas or the left-eye areas in the first exposure process and, after that, irradiating the entire surface with UV light in the second exposure process is described. However, the present invention is not limited thereto, but it may be widely applied to various types of exposure processes using a mask. In addition, these exposure processes include, for example, a case of exposing the entire surface in a first exposure process and partially performing alignment again by using a mask in a second exposure process, a case of performing alignment by exposing each of the right-eye areas and the left-eye areas by using a mask, and the like.

In addition, in the above-described embodiments, although the case of producing the pattern phase difference film on the assumption of the use of a liquid crystal display panel has been described, the present invention is not limited thereto. The present invention may be widely applied to cases where polarizing filters are integrally provided on the assumption of the use of an organic EL panel or a plasma display panel.

The invention claimed is:

1. A method for producing a patterned phase difference film by sequentially processing an elongated transparent film material while transporting the elongated transparent film material, comprising:

forming a photo-alignment material film on the transparent film material;

forming an alignment film by performing an exposure process on the photo-alignment material film by using a mask through a photo-alignment method; and forming a phase difference layer of a right-eye area applying phase difference corresponding to right-eye transmitting light and a left-eye area applying phase difference corresponding to left-eye transmitting light on the alignment film, wherein the exposure process is performed by irradiation of light through the mask disposed to face a roll while transporting the transparent film material wound around the roll, wherein the mask is formed so that slits which are used for the exposing of the photo-alignment material film a longitudinal direction of which is a direction corresponding to a longitudinal direction of the transparent film material are repetitively formed in a in a direction perpendicular to a longitudinal direction of the slit, and wherein the slit is formed so that one end side or two end sides in the longitudinal direction of the slit has a width being gradually decreased in the direction toward end portions in the longitudinal direction of the slit.

2. The method for producing a patterned phase difference film according to claim 1, wherein the slit is formed so that a central portion in the longitudinal direction of the slit has a constant width.

3. A mask being retained so as to face a roll for transporting an elongated transparent film material and being used for exposing a photo-alignment material film formed on the transparent film material transported by the roll, wherein slits used for the exposing of the photo-alignment material film are repetitively formed in a direction perpendicular to a longitudinal direction of the slits, and wherein the slit is formed so that one end side or two end sides in the longitudinal direction of the slit has a width being gradually decreased in the direction toward end portions in the longitudinal direction of the slit.

4. The mask according to claim 3, wherein the slit is formed so that a central portion in the longitudinal direction of the slit has a constant width.

* * * * *